US006288325B1

United States Patent
Jansen et al.

(10) Patent No.: US 6,288,325 B1
(45) Date of Patent: Sep. 11, 2001

(54) PRODUCING THIN FILM PHOTOVOLTAIC MODULES WITH HIGH INTEGRITY INTERCONNECTS AND DUAL LAYER CONTACTS

(75) Inventors: Kai W. Jansen, Lawrenceville, NJ (US); Nagi Maley, Exton, PA (US)

(73) Assignee: BP Corporation North America Inc., Chicago, IL (US)

( * ) Notice: Subject to any disclaimer, the term of this patent is extended or adjusted under 35 U.S.C. 154(b) by 0 days.

(21) Appl. No.: 09/564,209

(22) Filed: May 4, 2000

Related U.S. Application Data

(62) Division of application No. 09/115,316, filed on Jul. 14, 1998, now Pat. No. 6,077,722.

(51) Int. Cl.[7] .................... H01L 21/768; H01L 31/072
(52) U.S. Cl. .................... 136/249; 136/258; 136/251; 136/255; 136/256; 136/259; 257/53; 257/55; 257/51; 257/433; 257/443; 257/457; 257/461
(58) Field of Search .................... 136/249 MS, 249 TJ, 136/258 PC, 258 AM, 251, 255, 256, 259; 257/53, 55, 51, 433, 443, 457, 461

(56) References Cited

U.S. PATENT DOCUMENTS

| 5,403,404 | * | 4/1995 | Arya et al. ........................ 136/249 |
| 5,730,808 | * | 3/1998 | Yang et al. ....................... 136/249 |
| 6,077,722 | * | 6/2000 | Jansen et al. ..................... 438/74 |

FOREIGN PATENT DOCUMENTS

| 538840 | * | 4/1993 | (EP) . |
| 60-123072 | * | 7/1985 | (JP) . |

OTHER PUBLICATIONS

Willing et al, "Thermal Stability of Interconnected a–Si:H Solar Modules," 19th IEEE Photovoltaic Specialists Conference, pp. 1086–1089, May 4–8, 1987.*

Carlson and Rajan, "Irreversible Light–Enhanced Degradation in Amorphous Silicon Solar Cells at Elevated Tamperatures," Appl. Phys. Lett. 68(1), pp. 28–30, Jan. 1, 1996.*

Carlson et al, "Commercialization of Multijunction Amorphous Silicon Modules," 25th IEEE Photovoltaic Specialists Conference, pp. 1023–1028, May 13–17, 1996.*

* cited by examiner

Primary Examiner—Alan Diamond
(74) Attorney, Agent, or Firm—Thomas E. Nemo

(57) ABSTRACT

High performance photovoltaic modules are produced with improved interconnects by a special process. Advantageously, the photovoltaic modules have a dual layer back (rear) contact and a front contact with at least one layer. The front contact and the inner layer of the back contact can comprise a transparent conductive oxide. The outer layer of the back contact can comprise a metal or metal oxide. The front contact can also have a dielectric layer. In one form, the dual layer back contact comprises a zinc oxide inner layer and an aluminum outer layer and the front contact comprises a tin oxide inner layer and a silicon dioxide dielectric outer layer. One or more amorphous silicon-containing thin film semiconductors can be deposited between the front and back contacts. The contacts can be positioned between a substrate and an optional superstrate. During production, the transparent conductive oxide layer of the front contact is scribed by a laser, then the amorphous silicon-containing semiconductors and inner layer of the dual layer back contact are simultaneously scribed and trenched (drilled) by the laser and the trench is subsequently filled with the same metal as the outer layer of the dual layer back contact to provide a superb mechanical and electrical interconnect between the front contact and the outer layer of the dual layer back contact. The outer layer of the dual layer back contact can then be scribed by the laser. For enhanced environmental protection, the photovoltaic modules can be encapsulated.

16 Claims, 3 Drawing Sheets

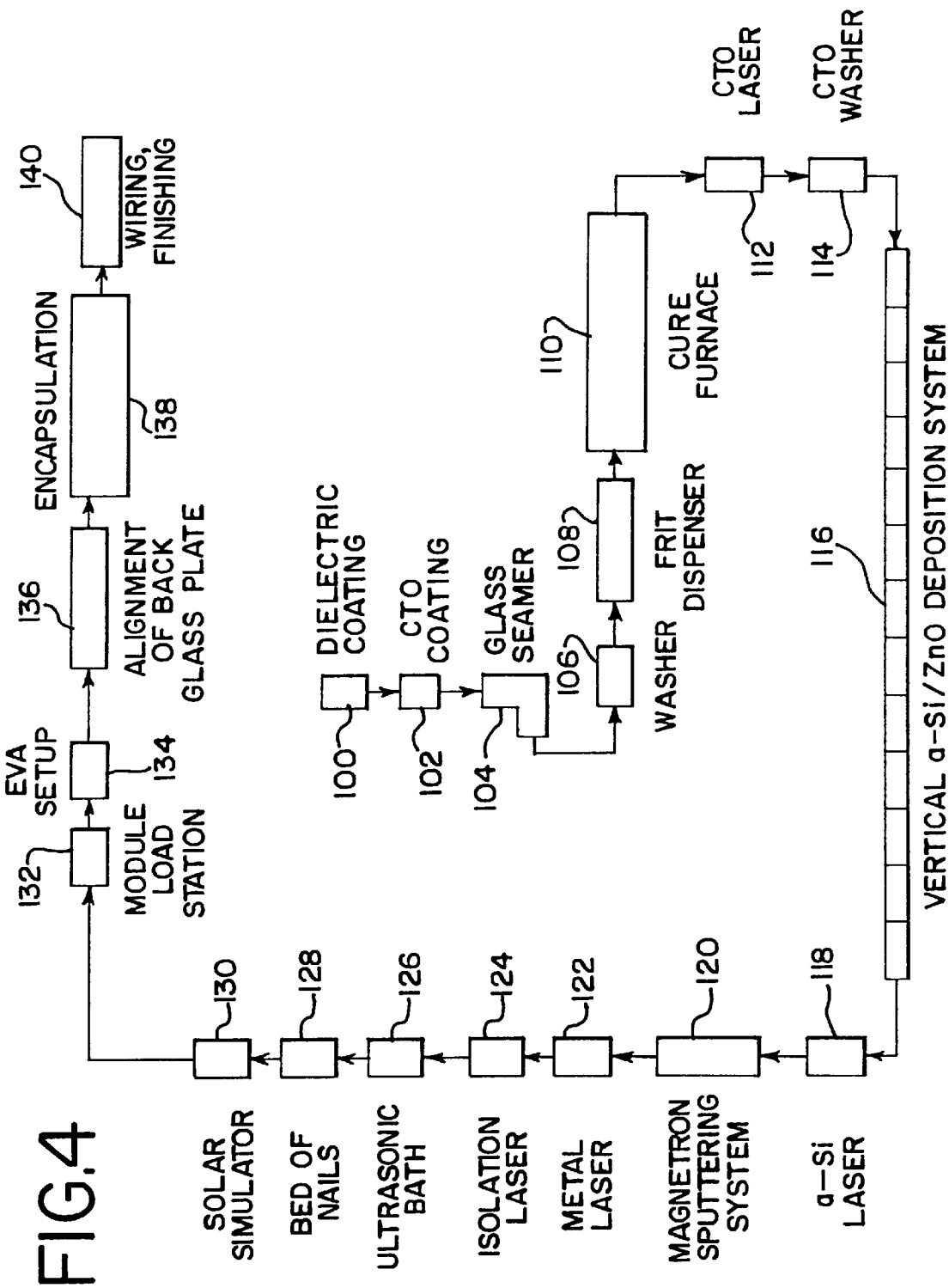

PRODUCING THIN FILM PHOTOVOLTAIC MODULES WITH HIGH INTEGRITY INTERCONNECTS AND DUAL LAYER CONTACTS

This is a divisional of application Ser. No. 09/115,316, filed Jul. 14, 1998, now U.S. Pat. No. 6,077,722.

This invention was made with Government support under NREL Subcontract No. ZAN-4-13518-01 under Prime Contract No. DE-AC36-83CH10093 awarded by the Department of Energy. The government has certain rights in this invention.

BACKGROUND OF THE INVENTION

This invention pertains to photovoltaic devices and, more particularly, to solar cells fabricated of amorphous silicon.

Solar cells and other photovoltaic devices convert solar radiation and other light into usable electrical energy. The energy conversion occurs as the result of the photovoltaic effect. Solar radiation (sunlight) impinging on a photovoltaic device and absorbed by an active region of semi-conductor material, e.g. an intrinsic i-layer of amorphous silicon, generates electron-hole pairs in the active region. The electrons and holes are separated by an electric field of a junction in the photovoltaic device. The separation of the electrons and holes by the junction results in the generation of an electric current and voltage. The electrons flow toward the region of the semiconductor material having an n-type conductivity. The holes flow toward the region of the semiconductor material having a p-type conductivity. Current will flow through an external circuit connecting the n-type region to the p-type region as long as light continues to generate electron-hole pairs in the photovoltaic device.

Single-junction devices comprise three layers. These are p- and n-layers which are extrinsic or doped and i-layer which is intrinsic or undoped (at least containing no intentional doping). The i-layer is much thicker than the doped layers. This is because mainly light absorbed in the i-layer is converted to electrical power which can be used in an external circuit. The thickness of the i-layer (sometimes called the absorber layer) determines how much light is absorbed. When a photon of light is absorbed in the i-layer it gives rise to a unit of electrical current (an electron-hole pair). However, this electrical current will go nowhere on its own. Hence, the p and n-layers. These layers, which contain charged dopant ions, set up a strong electric field across the i-layer. It is this electric field which draws the electric charge out of the i-layer and sends it through an external circuit where it can provide power for electrical components.

Thin film solar cells are typically constructed of amorphous silicon-containing semiconductor films on a substrate. The substrate of the solar cell can be made of glass or a metal, such as aluminum, niobium, titanium, chromium, iron, bismuth, antimony or steel. Soda-lime glass is often used as a substrate because it is inexpensive, durable and transparent. If a glass substrate is used, a transparent conductive coating, such as tin oxide ($SnO_2$) can be applied to the glass substrate prior to forming the amorphous silicon-containing semiconductor films. A metallic contact can be formed on the back of the solar cell. Solar cells are often placed in metal frames to provide attractive photovoltaic modules.

Over the years numerous solar cells have been developed which have met with varying degrees of success. Single junction solar cells are useful but often cannot achieve the power and conversion efficiency of multi-junction solar cells. Usually, multi-junction solar cells and single junction solar cells have been constructed of various materials which are able to capture and convert only part of the solar spectrum into electricity. Multi-junction solar cells have been produced with amorphous silicon and its alloys, such as hydrogenated amorphous silicon carbon and hydrogenated amorphous silicon germanium, with wide and low bandgap intrinsic i-layers. Amorphous silicon solar cells have a relatively high open circuit voltage and low current but can only respond to capture and convert into electricity wavelengths of sunlight from 400 to 900 nanometers (nm) of the solar spectrum.

An amorphous silicon solar cell is comprised of a body of hydrogenated amorphous silicon (a-Si:H) material, which can be formed in a glow discharge of silane. Such cells can be of the type described in U.S. Pat. No. 4,064,521 entitled Semiconductor Device Having A Body Of Amorphous Silicon which, issued to David E. Carlson on December 20, 1977. Within the body of the cell there is an electric field which results from the different conductivity types of the semiconductor regions comprising the body.

Amorphous silicon solar cells are often fabricated by the glow discharge of silane ($SiH_4$). The process of glow discharge involves the discharge of energy through a gas at relatively low pressure and high temperature in a partially evacuated chamber. A typical process for fabricating an amorphous silicon solar cell comprises placing a substrate on a heated element within a vacuum chamber. A screen electrode, or grid, is connected to one terminal of a power supply, and a second electrode is connected to the substrate. While silane, at low pressure, is admitted into the vacuum chamber, a glow discharge is established between the two electrodes and an amorphous silicon film deposits upon the substrate.

Amorphous hydrogenated silicon (a Si:H) based solar cell technology is a good candidate for large area, low-cost photovoltaic applications. The basic device structure is a single p-i-n junction or an n-i-p junction in which all layers are traditionally amorphous and are made in a continuous plasma deposition process.

Current output of a photovoltaic device is maximized by increasing the total number of photons of differing energy and wavelength which are absorbed by the semiconductor material. The solar spectrum roughly spans the region of wavelength from about 300 nanometers to about 2200 nanometers, which corresponds to from about 4.2 eV to about 0.59 eV, respectively. The portion of the solar spectrum which is absorbed by the photovoltaic device is determined by the size of the bandgap energy of the semiconductor material. Crystalline silicon (c-Si) has a bandgap energy of about 1.1 eV. Solar radiation (sunlight) having an energy less than the bandgap energy is not absorbed by the semiconductor material and, therefore, does not contribute to the generation of electricity, current, voltage and power, of the photovoltaic device.

The doped layers in the device play a key role in building up the strong internal electric field across the i-layer, which is the predominant force in collecting photocarriers generated in the i-layer. In particular, the doped layers in the recombination junction of a multi-junction solar cell have to support large electric fields extending into the intrinsic layers, in addition to the high field in the recombination junction itself. The interface region must promote efficient recombination of electrons, generated in the first i-layer, with holes from the second i-layer. Also, the tunnel junction layers should provide minimal optical absorption. However, the electrical properties of amorphous doped layers are relatively poor as compared to their crystalline counterparts. For instance, the conductivities are typically only $1 \times 10^{-6}$ $(\Omega \cdot cm)^{-1}$ for a-Si:H player and $\sim 1 \times 10^{-4} (\Omega \cdot cm)^{-1}$ for the n-layer. This is due partly to the low carrier mobilities in a-Si:H and partly to the low doping efficiencies in the disordered material. Moreover, the extremely high densities of tail states in amorphous materials prevent the Fermi levels from being too close to the band edges. The typical conductivity activation energies for a-Si:H p-layers and n-layers are $\sim 0.4$ eV and $\sim 0.2$ eV, respectively, thereby-limiting the open circuit voltage of the a-Si:H solar cells to $\sim 0.9$ V given its bandgap of $\sim 1.75$ eV.

At open circuit conditions, the voltage of the multi-junction solar cell should ideally be the sum of voltage developed across each p-i-n junction if there is no voltage dropped across the tunnel junctions. However, for non-ideal tunnel junctions a significant voltage in opposite polarity with that generated by the p-i-n junctions in the device can occur due to accumulation of photocarriers near the tunnel junction, and thus reduce the open circuit voltage.

Another important quality for the doped layers used in solar cells, besides good electrical properties, is low optical absorption. In contrast to single crystalline devices where p-n junctions can be used, photons absorbed in amorphous doped layers can be lost because the diffusion length of photo-carriers is extremely short in those layers. This requirement is especially important for the player through which light enters into the device. It is partly for this reason that amorphous silicon carbon (a-SiC:H) p-layers with an optical bandgap $\sim 2.0$ eV have often been used instead of amorphous silicon (a-Si:H) p-layers.

Converting amorphous a-Si:H to ,c-Si also lowers the optical absorption in the short wavelength region due to the selection rule for optical transition in crystalline grains. The absorption coefficient of oc-Si p-layer is higher than that of the amorphous silicon carbon (a-SiC:H) p-layer typically used in the solar cells. Doped microcrystalline silicon ($\mu$cSi) represents a very attractive alternative for a-Si:H based solar cells not only because of its much improved electrical and optical properties but also its compatibility with the enhanced plasma chemical vapor deposition process. However, except for very few reported successes, microcrystalline silicon so far has not been widely used in amorphous silicon (a-Si:H) solar cells, at least for commercial applications. The main difficulties are perhaps in making extremely thin layers of $\mu$c-Si($\leq 100$ Å), which is necessary in order to reduce the optical loss, and in alloying with carbon for raising the optical bandgap.

The bulk properties of microcrystalline silicon (etc-Si) are very different from those of extremely thin layers made under the same microcrystalline condition. Therefore, the bulk properties of microcrystalline silicon have little relevance to the application of $\mu$c-Si in solar cells where only ultra-thin layers are used. When examining the thickness dependencies of conductivity and activation energy for films made under conventional microcrystalline p-layer conditions, it can be observed that the film properties change dramatically when the microcrystalline thickness is below $\sim 1000$ Å. This is not surprising because it is well known that nucleation is critical in forming crystalline grains on a heterogeneous substrate. Also, the properties of those films made under "microcrystalline" conditions may be strongly substrate dependent, especially for ultra-thin layers. Furthermore, whether the substrate is conducting or insulating apparently also influences the initial nucleation of $\mu$c-Si, at least in D.C. plasma Previously, it has been found that microcrystalline silicon ($\mu$c-Si) forms much more readily on stainless steel substrates than on an amorphous silicon (a-Si:H) layer.

The segments, layers or cells of multi-junction solar cells are electrically interconnected, such as by laser scribing. High current polycrystalline solar cells generate greater power losses ($I^2R$) due to the resistance at the front and rear contacts, e.g. tin oxide contacts, than do amorphous silicon solar cells. Such power losses can be partially overcome by laser scribing more scribe lines and dividing the solar cell into smaller segments, such as 60 segments of 1 cm width. More scribe lines, however, decreases the active area of utilization of the solar cell which is available to capture and convert solar energy into electricity. Furthermore, deviations, voids and imperfections in the composition of polycrystalline can adversely effect the performance of polycrystalline solar cells.

In the past, the interconnects of some photovoltaic modules were not stable under thermal cycling and undesirably showed increases in series resistance after humidity freeze cycling. Such characteristics decrease performance of the photovoltaic modules.

It is, therefore, desirable to provide improved monolithic solar cells with amorphous silicon-containing semiconductor films with improved interconnects which overcome most, if not all, of the preceding problems.

SUMMARY OF THE INVENTION

A novel process is provided to produce high performance reliable photovoltaic modules with improved interconnects. Advantageously, the special process and superior photovoltaic modules are economical, user-friendly, attractive, and efficient. Desirably, high quality interconnects of the photovoltaic modules are stable under thermal recycling and do not significantly increase in series resistance after humidity freeze cycling.

In the process, a single or dual layer front contact is positioned on a substrate and at least one amorphous silicon-containing thin film semiconductor is deposited on the front contact. The substrate can be stainless steel or other metal, but preferably comprises a vitreous glass substrate. Advantageously, a dual layer back (rear) contact is deposited on the thin film semiconductor. One of the layers of each of the contacts can comprise a wide band gap semiconductor, preferably a transparent metallic conductive oxide, such as tin oxide, indium-tin oxide, zinc oxide, or cadmium stannate. Desirably, the other layer of the dual layer back contact comprises a metal, such as: aluminum, silver, molybdenum, platinum, steel, iron, niobium, titanium, chromium, bismuth, antimony, or oxides of the preceding. The front contact can also have a second layer comprising a dielectric, such as silicon dioxide.

The thin film semiconductor preferably comprises an amorphous silicon-containing material, such as: hydrogenated amorphous silicon, hydrogenated amorphous silicon carbon, or hydrogenated amorphous silicon germanium. The photovoltaic modules preferably comprise monolithic solar cells, such as: single junction solar cells, multi-junction solar cells, dual junction (tandem) solar cells or triple junction solar cells. If desired, a portion of the photovoltaic module can be microcrystalline or polycrystalline.

A conductive paste, such as a fritted conductive paste, can be deposited on the substrate and then heated and bonded to the substrate to provide a means of collecting current and to allow a solderable external connection.

In the preferred process, the transparent conductive oxide of the front contact, is laser scribed in a pattern, and the semiconductor layers are deposited on the front contact by enhanced plasma chemical vapor deposition Thereafter, the transparent conductive oxide first layer of the dual layer rear contact is deposited on the rear (back) layer of the semiconductor. Advantageously, the semiconductor layers and the transparent conductive oxide first layer of the dual layer rear contact are simultaneously laser scribed in a pattern parallel to the front pattern on the front contact and a trench is formed. Subsequently, a metallic second layer on the rear contact is deposited on the transparent conductive oxide first layer of the rear contact Desirably, the metal of the second layer fills the trench and provides a superb mechanical and electrical interconnect (interconnection) between the front contact and the metallic second layer of the rear contact. The metallic second layer of the rear contact is then laser scribed in a pattern parallel to the pattern on the semiconductor and first layer of the rear contact to isolate the segments of the photovoltaic module and provide series interconnects for the dual layers of the rear contact. A perimeter can then be laser scribed around the photovoltaic module to completely isolate the segments of the photovoltaic module from each other, except through the interconnects. The photovoltaic module can then be cured by generating a direct current across adjacent segments in a reverse bias orientation to remove shunts and shorts and decrease parasitic losses.

An encapsulating material such as ethylene vinyl acetate (EVA) and/or Tedlar type plastic can be deposited on the back second layer of the rear contact, and a superstrate can be laminated to the photovoltaic module to provide enhanced environmental protection for the photovoltaic module.

In the preferred form: the superstrate and substrate are glass, the transparent conductive oxide of the front contact is tin oxide, the transparent conductive oxide first layer of the rear contact is zinc oxide and the metallic second layer of the rear contact and the interconnect are aluminum. The semiconductor preferably comprises tandem dual junction cells (panels) comprising an amorphous silicon p-i-n or n-i-p cell and an amorphous silicon germanium p-i-n or n-i-p cell.

The above process and photovoltaic modules produced unexpected surprisingly good results.

The inventive monolithic solar cells are able to capture a broader spectrum of sun light and convert and harness a greater amount of solar energy into electricity. Advantageously, the monolithic solar cells and process for their production are efficient, effective, reliable, and economical. As used in this application, the term "monolithic" means a solar cell comprising a front contact and a rear-contact. The segments, layers, or cells of a monolithic solar cell are electrically and optically connected to each other to form one solar cell.

The transparent conductive oxide, such as zinc oxide or tin oxide, can be deposited by low pressure chemical vapor deposition (LP CVD). The layer of doped and undoped amorphous silicon and microcrystalline amorphous silicon can be deposited by enhanced plasma chemical vapor deposition (EP CVD), also referred to as plasma enhanced chemical vapor deposition (PE CVD). For triple junction solar cells, an amorphous silicon germanium semiconductor can be deposited on the n-type conductor by EP CVD, and an amorphous silicon conductor can be deposited by EP CVD on the amorphous silicon germanium semiconductor.

The multi-junction solar cells can also be fabricated by forming a microcrystalline sandwich with a n-type semiconductor (conductor) comprising a microcrystalline tunnel junction layer between a polycrystalline solar cell and an adjoining n-i-p amorphous silicon-containing solar cell. The amorphous silicon-containing solar cell has a positively doped p-layer, an active instrinic i-layer, and a negatively doped n-layer. A tunnel junction or recombination junction connects the polycrystalline back solar cell to the amorphous silicon-containing solar cell. The tunnel junction can comprise a negatively doped layer from one of the solar cells, a positively doped layer from the other solar cell, and at least one intermediate tunnel junction layer positioned between the polycrystalline and amorphous silicon-containing second solar cells.

The tunnel junction layer can be fabricated by etching and treating one of the doped layers in the tunnel junction to form an etched surface thereon and, thereafter, nucleating from the etched surface to form and grow a microcrystalline tunnel junction layer. As used in this application, the term "nucleating" means the initial growth phase of microcrystalline layers. Etching can comprise enhanced plasma chemical vapor deposition with an enchant (treatment material), such as hydrogen, deuterium, HD, helium, and argon. Preferably, etching comprises hydrogen etching alone by DC or RF enhanced plasma chemical vapor deposition while preventing substantial optical and electrical damage to the doped layers. Desirably, for best results, silane or other feedstock is prevented from being deposited with the enchant.

Nucleation from the etched surface can be provided to accelerate microcrystalline growth. Microcrystalline nucleation can be accomplished by enhanced plasma chemical vapor deposition with a dopant and a feedstock diluted with a diluent. The dopant can be: a negative dopant comprising a n-type dopant, such as phosphine ($PH_3$) or other phosphorous-containing compounds; or a positive dopant comprising a p-type dopant, such as diborane ($B_2H_6$) $BF_3$, or other boron-containing compounds. The feedstock can be: silane ($SiH_4$), disilane ($Si_2H_6$), tetramethyl silane, $Si(CH_3)_4$, $SiF_4$, $SiHF_3$, $SiH_2Cl_4$, $CH_N(SiH_3)_{4-N}$ wherein N is an integer in the range of 0 to 3, a carbon based feedstock, or a germanium based feedstock. The feedstock can also have the general formula $Si_NH_{2N+2-M}Y_M$ wherein:

Si=silicon

H=hydrogen or deuterium

Y=a halogen [fluorine (F), chlorine (Cl), bromine (Br), Iodine (1), etc.]

N=positive integer $\geq 1$

M=positive integer; and

2N+2−M$\geq$0.

The diluent can be hydrogen ($H_2$), deuterium ($D_2$), or HD. The dilution ratio of the diluent to the feedstock can range from about 50: 1 to about 200:1.

Plasma enhanced chemical vapor deposition (PECVD) can be by: cathodic direct current (DC) glow discharge, anodic DC glow discharge, radio frequency (RF) glow discharge, very high frequency (VHF) glow discharge, alternating current (AC) glow discharge, or microwave glow discharge. Plasma enhanced chemical vapor deposition of microcrystalline layers can be accomplished at a temperature ranging from 80–300° C., at a pressure ranging from 0.5–5 Torr, with a dilution ratio of diluent to the feedstock (deposition gas) ranging 50:1 to 200:1.

The tunnel junction of the multi-junction solar cell can have an etched surface and at least one microcrystalline tunnel junction layer sandwiched between the doped layer of one solar cell and an opposite doped layer of the other solar cell. The etched surface can be a hydrogen plasma etched surface, such as a n-doped amorphous silicon surface or a p-doped amorphous silicon surface. The microcrystalline tunnel junction layer can be a p-type microcrystalline layer and/or an n-type microcrystalline layer and the microcrystalline layer can be microcrystalline silicon carbon, microcrystalline silicon germanium, or microcrystalline silicon. The microcrystalline layer can have a thickness of 50–120 Å, preferably from 80–100 Å. The tunnel junction can comprise an n-type doped non-crystalline amorphous layer, an n-type microcrystalline tunnel junction layer, and a p-type doped noncrystalline amorphous layer. Tunnel junction can also comprise a p-type microcrystalline tunnel junction layer in lieu of or in addition to the n-type microcrystalline tunnel junction layer.

A more detailed explanation of the invention is provided in the following description and appended claims taken in conjunction with the accompanying drawings.

BRIEF DESCRIPTION OF THE DRAWINGS

FIG. 4 is a process flow diagram for producing solar cells in accordance with principles of the present invention.

DETAILED DESCRIPTION OF THE PREFERRED EMBODIMENTS

Figure 1:
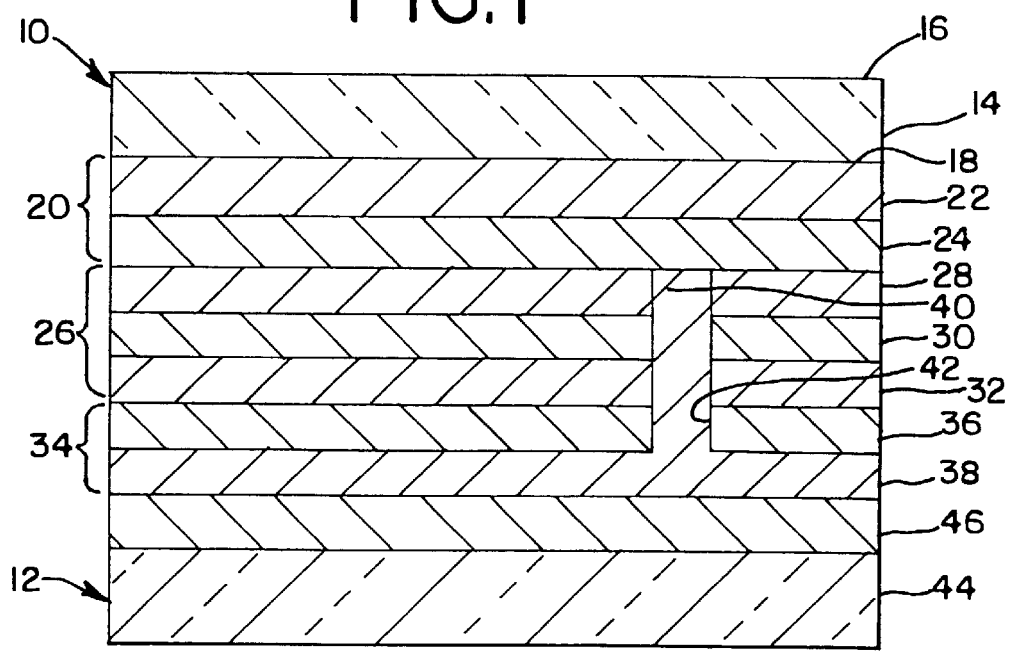
FIG. 1 is a cross-sectional view of a monolithic single-junction solar cell in accordance with principles of the present invention.

The monolithic photovoltaic (PV) module 10 of FIG. 1 provides a photovoltaic device which comprises a single junction solar cell 12. The solar cell has a generally planar or flat, light transmissive vitreous substrate 14 made of opaque glass, translucent glass, or most preferably, transparent glass, which provides the front glass of the photovoltaic module. The substrate has an external outer (outside) surface 16 and an inwardly facing inner surface 18. The substrate comprises a sodium-containing glass, such as soda-lime glass.

A dual layer front contact 20 (FIG. 1) can be disposed, deposited, positioned and lies upon the substrate. The dual layer front contact can comprise a dielectric outer front layer 22 comprising silicon dioxide positioned upon and abutting against the inner surface of the substrate and transparent metallic conductive oxide (TCO) inner back (rear) layer 24 also referred to as a CTO layer or coating, which provides a wide band gap front semiconductor, positioned upon, adjacent and abutting against the dielectric layer. The dielectric layer and the TCO layer can be deposited by low pressure chemical vapor deposition (LP CVD), or other methods. The TCO layer comprises a transparent metallic oxide, such as indium-tin-oxide, zinc oxide, cadmium stannate, or preferably tin oxide having a thickness less than 10,000 Å.

An amorphous silicon-containing thin film semiconductor 26 (FIG. 1) provides a single junction solar cell. The amorphous silicon semiconductor solar cell comprises a p-i-n or preferably an n-i-p amorphous silicon thin film semiconductor with a bandgap ranging from about 1.4 eV to 1.75 eV, usually to 1.6 eV. The amorphous silicon semiconductor or segment can comprise: hydrogenated amorphous silicon, hydrogenated amorphous silicon carbon or hydrogenated amorphous silicon germanium. The positively doped (p-doped) amorphous silicon p-layer 28 of the amorphous silicon semiconductor is positioned, disposed and deposited on, covers, lies upon, and is connected to the TCO layer of the front contact. The p-layer can be positively doped with diborane ($B_2H$), $BF_3$ or other boron-containing compounds. An amorphous silicon, undoped, active intrinsic i-layer 30 is deposited upon, positioned between and connected to the p-layer and a negatively doped (n-doped) amorphous silicon n-layer 32. The n-layer is positioned on the i-layer and can comprise amorphous silicon carbon or amorphous silicon negatively doped with phosphine ($PH_3$) or some other phosphorous-containing compound Amorphous silicon can be doped by adding impurities to the silane. For example, the first dopant may be diborane ($B_2H_6$), which is added to the silane to form a p-type amorphous silicon layer. After the p-type layer has been formed to a thickness on the order of 100 Angstroms (Å), preferably less than 150 Å, the diborane flow is stopped to form an intrinsic region having a thickness on the order of a few 1000 Angstroms, preferably 2500–4500 Å. Thereafter, an n-type dopant, such as phosphine ($PH_3$), is added to the silane flow in order to form an n-type amorphous silicon layer having a thickness of a few 100 Angstroms, preferably less than 150 Å. The p-i interface can be amorphous silicon carbon containing perhaps 5% carbon at the edge of the p-layer. The composition is then linearly graded until it contains no carbon at the i-layer edge. However, there are many ways to make a p-i interface, not all of which involve grading or using carbon A dual layer rear contact (back contact) contact 34 (FIG. 1) is deposited and positioned upon and connected to the amorphous silicon n-layer of the solar cell. The inner metallic front layer 36 of the rear contact can comprise a transparent metallic conductive oxide, such as tin oxide (TCO or CTO) comprising a wide gap rear (back) semiconductor, such as tin oxide, indium-tin-oxide, cadmium stannate, and preferably zinc oxide. The outer metallic rear (back) layer 38 of the rear contact can comprise a metal, such as silver, molybdenum, platinum, steel, iron, niobium, titanium, chromium, bismuth, antimony, or preferably aluminum. The TCO inner layer can be deposited by low pressure chemical vapor deposition (LP CVD), spray coating or other methods. The outer metallic layer can be deposited by sputtering or other methods.

An interconnect 40 (FIG. 1) provides a strong mechanical connection and an electrical contact between the tin-oxide inner TCO layer of the front contact and the aluminum outer layer of the rear contact. The interconnect preferably is integral with and comprises the same metal as the outer layer of the rear contact. In the preferred embodiment, the interconnect is aluminum. The interconnect extends through a trench (hole) 42 in the semiconductor and the zinc oxide inner layer of the rear contact The trench can be formed and scribed simultaneously with a laser through the amorphous silicon containing semiconductor and zinc oxide inner layer of the rear contact. The interconnect preferably fills the trench and connects the tin oxide inner TCO layer of the front contact and the aluminum outer layer of the rear contact.

A transparent vitreous superstrate 44 (FIG. 1) comprising sodium-containing glass, such as soda-lime glass, is placed and positioned upon the back (rear) contact of the photovoltaic module and device. The photovoltaic module can be encapsulated with an encapsulating material (encapsulant) 46, such as ethylene vinyl acetate (EVA), to help protect the photovoltaic module from the environment Other encapsulants can be used with or in place of the EVA, such as: Tedlar tpe plastic, Nuvasil type plastic, Tefzel type plastic, ultraviolet (UV) curable coatings, etc. and combinations thereof. The photovoltaic module can be unframed or can be partially or filly framed, supported or secured by a metal support comprising a metal member, such as a metal mounting structure, metal struts, or preferably a metal frame.

Figure 2:
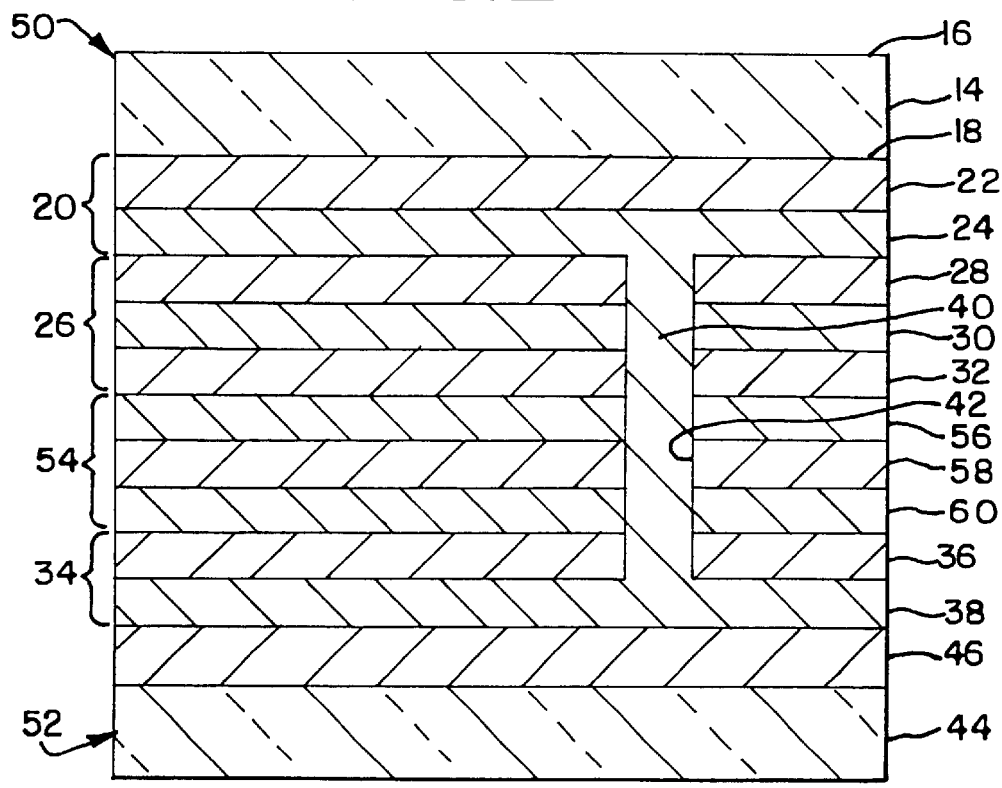
FIG. 2 is a cross-sectional view of a monolithic tandem junction solar cell in accordance with principles of the present invention.

The monolithic module 50 of FIG. 2 provides a photovoltaic device which comprises a tandem dual (multi) junction solar cell 52. The dual junction solar cell of FIG. 2 is generally structurally, physically and functionally similar to the single junction solar cell of FIG. 1, except as explained below. For ease of understanding, similar components and parts of the solar cells of FIGS. 1 and 2 have been given similar part numbers, such as substrate 14, front contact 20 with outer dielectric layer 22 and inner TCO layer 24, amorphous silicon-containing thin film semiconductor 26 which provides front solar cell or segment, dual layer rear contact (back contact) 34 with a TCO inner metallic layer 36 and an outer metallic layer 38, interconnect 40, trench 42, superstrate 44 EVA 46, etc. The n-i-p rear solar cell has n, i, and players, which are arranged as previously explained. The n, i, and p-layers of the rear cell are sometimes referred to as the $n_1$ $i_1$ and $p_1$-layers, respectively, of the rear cell. The front cell of the tandem junction solar cell can have a bandgap of 1.4 eV to 1.75 eV and preferably comprise hydrogenated amorphous silicon with a bandgap of 1.6 to 1.75. A rear (back) solar cell 54 comprising an amorphous silicon-containing thin film semiconductor is sandwiched and positioned between and operatively connected to the front cell and the rear (back) contact. The rear amorphous silicon cell can be similar to the front amorphous silicon cell described above. The front amorphous silicon cell or segment has a bandgap of about 1.4 eV to 1.75 eV, usually to 1.6 eV and preferably comprises hydrogenated amorphous silicon germanium with a bandgap of 1.4 eV. The amorphous silicon positively doped $p_2$-layer 56 of the rear cell is positioned disposed and deposited on, cover, lies and is the amorphous silicon negatively doped $n_1$-layer 32 of the front cell. The amorphous silicon intrinsic $i_2$-layer 58 of the rear cell is deposited upon, sandwiched, positioned between and connected to the $n_2$-layer 60 and $p_2$-layer of the rear cell.

In multi-junction (multiple junction) solar cells, such as the tandem junction solar cells of FIG. 2, the i-layers of the amorphous silicon containing cells can comprise an active hydrogenated compound, such as amorphous silicon, amorphous silicon carbon or amorphous silicon germanium. The active p-layers of the amorphous silicon-containing cells can comprise a p-doped hydrogenated compound, such as p-doped amorphous silicon, p-doped amorphous silicon carbon or p-doped amorphous silicon germanium. The active n-layers of the amorphous silicon-containing cells can comprise an n-doped hydrogenated compound, such as n-doped amorphous silicon, n-doped amorphous silicon carbon or n-doped amorphous silicon germanium.

A preferred process to produce the tandem junction solar cells of FIG. 2 is shown in the process flow diagram of FIG. 4. The inner surface of the glass substrate (front glass) can be coated with a dielectric layer at a dielectric coating station 100. The optional dielectric layer can be deposited on the glass substrate by spraying (spray coating), low pressure chemical vapor deposition (LP CVD) or other methods. The glass substrate can be coated with an inner layer of transparent metallic conductive oxide (CTO or TCO), preferably tin oxide, at a glass CTO coating station 102. The tin oxide can be deposited on the glass substrate by spraying (spray coating) or LP CVD, or other methods. The rough edges of the coated glass substrate are ground to a smooth radius at a glass seamer 104 to reduce chipping and cracking. The glass substrate is then washed and cleaned in a seamed glass washer 106 to remove grinding fluids, particulates, debris, and other contaminants from the glass substrate to assure good adhesion.

A silver fritted conductive paste comprising silver, organic solvents and organic binders is deposited on the glass substrate at a silver frit dispenser 108 (FIG. 4). The glass substrate is then conveyed or otherwise moved to a frit cure (curing) furnace 110 where the glass and silver fritted conductive paste are heated to about 540° C. to evaporate or otherwise remove the organic solvents and burn, sinter or otherwise remove the organic binders. The silver fritted conductive paste is fired to a film in the furnace 110 and is bonded to the glass substrate to provide a means of collecting current and allowing a solderable external connection.

A first pattern (CTO pattern) which provides the cell pattern of the photovoltaic module is scribed by a laser 112 (FIG. 4). During laser scribing, the laser removes strips, such as 0.001 inch strips, of tin oxide from the tin oxide-coated glass substrate in accordance with a preselected pattern. The strips can extend from about 0.1 inches from each edge of the glass substrate. The laser scribed tin oxide-coated substrate is subsequently washed and cleaned in a CTO washer 114 to remove oil, CTO scribe debris, particulates, and waste from the laser scribed substrate.

The laser scribed substrate is conveyed through a series of deposition chamber 116 (FIG. 4) where the amorphous silicon-containing thin film semiconductors are sequentially deposited on the glass substrate in a n-i-p or p-i-n configuration by enhanced plasma chemical vapor deposition (EP CVD). The glass substrate can be heated to a temperature such as about 200° C. preceding and during EP CVD. In order to produce the tandem junction solar cells of FIG. 2, it is preferred to sequentially deposit n-i-p or p-i-n layers of hydrogenated amorphous silicon germanium. Thereafter, a layer of transparent metallic conductive oxide (CTO or TCO), preferably zinc oxide, is deposited on the back (rear) layer of the thin film semiconductor in the downstream portion of the deposition chambers 116 by low pressure chemical vapor deposition (LP CVD) or other methods. The zinc oxide provides the inner layer of the dual layer rear contact.

The zinc oxide-coated thin film semiconductors are then scribed by an amorphous silicon scribing laser 118 (FIG. 4) in a second pattern of interconnect scribes (second pattern) parallel to the fist CTO scribe pattern in order to separate the layers into segments and form (drill) a trench (hole) through the zinc oxide-coated thin film amorphous silicon- containing semiconductors. During this laser interconnect scribing step, all semiconductor material and zinc oxide in the scribes are removed, without damaging the tin oxide coating on the substrate. A metal, preferably aluminum, is sputtered by a magnetic sputtering system 120 or otherwise deposited on the scribed zinc oxide layer to provide a uniform metallic outer layer (rear layer) of the dual layer rear contact. Simultaneously or concurrently therewith, a metal, preferably aluminum, is sputtered by the magnetic sputtering system 120 or by other methods to fill the trench so as to form a series interconnect (interconnection) which mechanically and electrically connects the aluminum outer layer of the rear contact with the tin oxide layer of the front contact.

The aluminum outer layer of the rear contact is scribed by a metal scribing laser 122 (FIG. 4) in a third pattern parallel to the interconnect scribes (second pattern) to isolate the segments from each other so as to complete the series interconnection between segments of the photovoltaic modules. All layers of the photovoltaic modules are then scribed by an isolation laser 124 to form an isolation perimeter, such as a 0.1 inch perimeter, around the periphery of the photovoltaic module. The isolation perimeter contains no electrically conductive material and thereby isolates and insulates the segments from each other, except through the series interconnects.

The shunting paths between segments of the photovoltaic module can be alleviated and removed by generating or imposing a controlled DC current across adjacent segments of the photovoltaic modules in a reverse bias operation in an electrical curing apparatus 128 (FIG. 4), sometimes referred to as a bed of nails or shunt curing apparatus. This procedure clears the shunts and burns out or otherwise remove shorting material to reduce parasitic losses. The photovoltaic modules are then measured under standard conditions in a solar simulator 130. The performance of the photovoltaic modules are labeled or otherwise identified by power, voltage, or current and separated into bins.

The vitreous superstrate comprising the back glass can be loaded on conveyors at a module load station 132 (FIG. 4). An encapsulating material, preferably ethylene vinyl acetate (EVA), is dispensed from a roll at an EVA setup station 134 to cover the aluminum outer layer of the rear contact and the photovoltaic module. EVA provides a bonding material to bond the superstrate (back glass) to the photovoltaic module. At the alignment station 136, the back glass (superstrate) is aligned with the EVA sheet and photovoltaic module. The aligned superstrate, EVA and photovoltaic module are then laminated and encapsulated in vacuum laminator 138 in an encapsulation and vacuum lamination process. The encapsulation and back glass provide environmental protection for the photovoltaic modules.

In the wiring-and finishing station 140 (FIG. 4), wires are soldered to the frit comprising the metal and frit based conductor film on the substrate (front glass) through holes precut in the superstrate (back glass) to provide access to the solar electrical energy collected by the photovoltaic modules. The solder joints can be potted with epoxy for additional environmental protection. The completed photovoltaic modules are then tested and packaged.

The process for producing single junction solar cells of the type shown in FIG. 1 is similar to the process shown and described in connection with FIG. 4, except only one thin film semiconductor is sequentially deposited in n-i-p or p-i-n layers in the deposition chamber 116.

The process for producing triple junction solar cells of the type shown in FIG. 3, can be similar to the process shown and described in connection with FIG. 4, except that three semiconductors are sequentially deposited as hereinafter described in the deposition chamber 116.

In some circumstances, it may be desirable that one or more of the cells be formed in separate deposition chambers or other apparatus, e.g. where crystalline cells are used.

In order to obtain better utilization of the solar spectrum and to improve stability, two or more p-i-n or n-i-p junctions with i-layer materials of different bandgaps can be built in series to form a monolithic multi-junction solar cell. The interface between the two amorphous silicon junctions, often called the tunnel junction or recombination junction, can also be a microcrystalline tunnel junction.

The use of microcrystalline silicon in the doped layers of the recombination junction can offer many advantages: (1) the higher carrier density generally available in microcrystalline versus amorphous silicon more easily supports the high electric fields required while using very thin layers; (2) more efficient recombination occurs due to the smaller mobility gap and the increased doping density, as well as to increased tunneling in the very thin layers; and (3) the optical absorption loss due to the tunnel junction layers can be reduced because of the lower absorption coefficient of microcrystalline silicon ($\mu$c-Si) in the visible wavelengths as well as because of the use of thinner layers. The high doping density and high electric field associated with the use of microcrystalline silicon ($\mu$c-Si) can improve open circuit voltage ($V_{oc}$). More efficient recombination in the tunnel junction will minimize charge accumulation near that junction. Furthermore, the short circuit current of the tandem device may be increased by use of microcrystalline tunnel junction layers.

Figure 3:
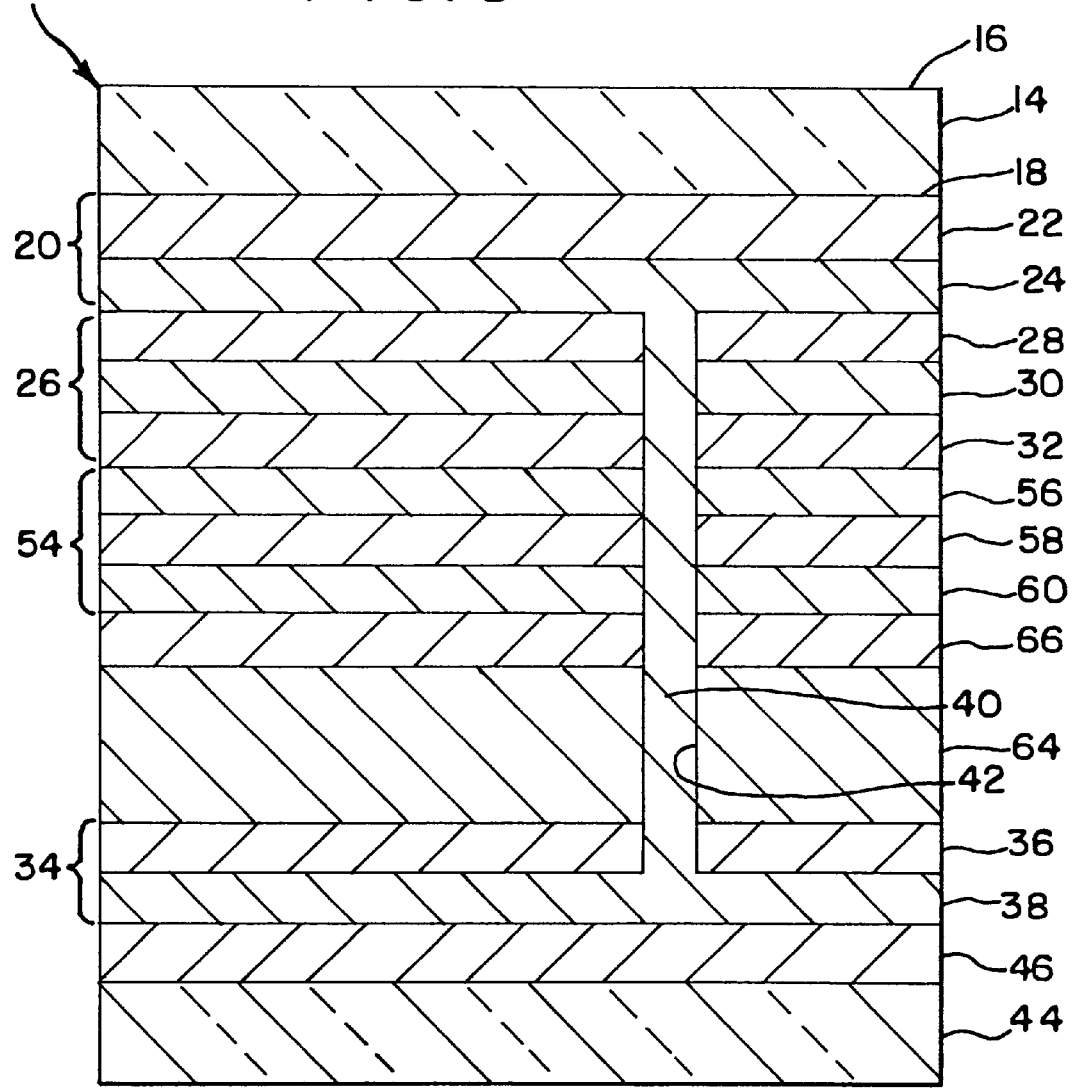
FIG. 3 is a cross-section view of a monolithic triple junction solar cell in accordance with principles of the present invention.

The monolithic photovoltaic module 62 of FIG. 3 provides a photovoltaic device which comprises a triple junction solar cell. The triple junction solar cell of FIG. 3 is generally structurally, physically and functionally similar to the tandem junction solar cell of FIG. 2, except as explained below. For ease of understanding, similar components and parts of the solar cells of FIGS. 2 and 3 have been given similar part numbers, such as substrate 14, front contact 20 with outer dielectric layer 22 and inner TCO layer 24, an n-i-p front solar cell, semiconductor, or segment 26 with an $n_1$-layer 28, $i_1$-layer 30, and an $p_1$-layer 32, an n-i-p solar cell or semiconductor 54, which can provide an intermediate middle cell or segment for the triple junction solar cell, with a $n_2$-layer 60, an $i_2$-layer 58, and a $p_2$-layer 56, dual layer rear (back) contact 34 with inner TCO layer 36 and outer metallic layer 38, interconnect 40, trench 42, superstrate 44, EVA 46, etc. In the triple junction solar cell of the photovoltaic module for FIG. 3, the $p_2$-layer of the intermediate cell, can be positioned, above, deposited adjacent, cover, lie, and is connected to a back (rear) solar cell 64. While the back cell of FIG. 3 can be an amorphous silicon-containing cell, similar to the intermediate (middle) or front cell, it is preferred than the back cell comprise a polycrystalline cell, most preferably a thin polycrystalline silicon cell.

In some circumstances, it may be desirable to use a different arrangement of the triple junction solar cell, for example, it may be useful that the polycrystalline cell be the front cell, or that the amorphous silicon cell be the intermediate or rear cell, or that the amorphous silicon germanium cell be the rear cell or intermediate cell etc.

If desired, the front cell of the triple junction solar cell can comprise a copper indium polycrystalline semiconductor back or rear cell positioned on and connected to the rear contact on the substrate. The polycrystalline back cell or back segment can comprises a copper indium polycrystalline semiconductor with a bandgap ranging from 1 eV to 1.2 eV. The copper indium polycrystalline semiconductor can comprise copper indium diselenide (CIS) with a bandgap of 1 to 1.04 eV or copper indium gallium selenide (CIGS) with a bandgap of 1 to 1.2 eV. The CIGS semiconductor can have (0.1% to 24% by weight galliumn. Generally, the greater the amount of gallium, the higher the bandgap. There are situations when CIGS is preferred over CIS and vice versa. CIS or CIGS can be is deposited by evaporation at a temperature ranging from 400° C. to 500° C.

An n-type (negative type) conductor or semiconductor 66 (FIG. 3) provides an n-doped (negative-doped) connector and tunnel junction which is sandwiched and positioned between and operatively connected to the polycrystalline back cell and the amorphous silicon intermediate middle cell. The n-type conductor can comprise a negatively doped (n-doped) amorphous silicon n-layer or cadmium sulfide. Cadmium sulfide (CdS) when used as the n-type conductor, can be deposited by sputtering, evaporation, or solution growth. Preferably, the n-pe conductor comprises microcrystalline n-doped (negatively doped) amorphous silicon providing a microcrystalline n-layer ($\mu$n layer). The An layer can have a thickness of about 50 Å to 120 Å, preferably 80 Å to 100 Å. The negatively doped, n-type conductor comprising microcrystalline negatively doped (n-doped) amorphous silicon, can be deposited by enhanced plasma chemical vapor deposition (EP CVD). The n-type conductor serves to couple, secure and connect the back cell to the front or middle cells (segments).

There are many advantages to the triple junction solar cells of FIG. 3. The first is Fight absorption. The different amorphous alloys absorb different parts of the solar specs Amorphous silicon carbon (a-SiC) absorbs ultraviolet (UV) light efficiently e passing most visible and all infrared light Amorphous silicon (a-Si) absorbs UV light (but not as efficiently as a-SiC), absorbs visible light efficiently, but does not absorb much infrared (IR) light Amorphous silicon germanium (a-SiGe) absorbs IR efficiently and UV and visible light generally inefficiently. Polycrystalline can absorb the remaining light in the range from 900 to 1400 nm. Another benefit of triple junction and other multi-junction solar cells is that each layer (unction) can have a different absorbing layer, so that virtually all wavelengths of light can be absorbed efficiently. A further benefit of multi-junction solar cells is that because the absorbing layers are tailored to the solar spectrum and absorb light efficiently, they can be thinner. Thinner layers are more stable with respect to the Staebler-Wronski effect.

In operation, sunlight or light from other sources, enters the top of the monolithic triple junction solar cell and passes through the transparent conductive oxide comprising the front contact The light then passes through the amorphous silicon front cell. Much, if not most, of the light in the bandgap of 400 to 900 nanometers (nm) are captured, absorbed and converted to electricity by the amorphous silicon front cell. The light then passes through the amorphous silicon germanium middle cell. Most, if not all, of the remaining light in the bandgap of 400 to 900 nm are captured, absorbed and converted to electricity by the amorphous silicon germanium middle cell. The remaining light then passes through the polycrystalline back (rear) cell where much, if not most of the light in the bandgap over 900 nm and primarily 900–1400 nm, are captured, absorbed and converted to electricity. Any remaining light will be reflected back to the rear (back) cell for further conversion, by the shing and reflective aluminum of the bimetallic rear contact. The combination and interaction of the amorphous silicon-containing cells and the polycrystalline cell can achieve a higher overall conversion of solar energy and light to electricity. Because the polycrystalline back cell is interconnected to the amorphous silicon front cell, the polycrystalline back cell can have some impurities, voids, or deviations without substantially impairing the overall performance of the monolithic multi-junction solar cell.

The bandgap and characteristics of the polycrystalline back cell can be varied, fined tuned, and controlled by changing the amount of silicon or gallium in the polycrystalline back cell. A CIS back cell can have a bandgap of 1 to 1.04 eV. A CIGS back cell with 20–24% by weight gallium can have a bandgap as high as 1.2 eV. Decreasing the amount of gallium in the CIGS back cell can alter and control the bandgap of the back cell to any desired level between 1 and 1.2 eV.

The bandgap and characteristics of the thin film front cell and thin film middle cell can be varied, fine tuned and controlled by changing the composition or thickness of the amorphous silicon and by using different alloys, to attain the desired levels between 1.4 to 1.75 eV.

It is therefore, apparent that the resulting optical bandgap and electrical characteristics of the monolithic multi-junction solar cell can be varied, fine tuned and controlled, in the preceding manner, to achieve the desired electrical properties.

The amorphous silicon containing, thin film semiconductor cells are deposited by enhanced plasma chemical vapor deposition (EP CVD), such as at a temperature of about 180° C. to about 200° C. The $n_1$ and $n_2$ layers of the amorphous silicon-containing cells can be formed by enhanced plasma enhanced chemical vapor deposition with a n-type dopant, such as phosphine ($PH_3$) or other phosphorous-containing compounds. The $p_1$ and $p_2$ layers of the amorphous silicon-containing cells can be formed by enhanced plasma chemical vapor deposition with a p-type dopant, such as diborane ($B_2H_6$). $BF_3$, or other boron-containing compounds. Plasma enhanced chemical vapor deposition can comprise DC or RF glow discharge under the following conditions: a temperature of the substrate ranging from about 80° C. to about 300° C.; a pressure ranging from about 0.5 to about 5 Torr; and a power density ranging from about 50 to about 230 mW/cm$^2$.

The top layer of the polycrystalline back cell can be treated with a hydrogen plasma etch, preferably without silane, for a period of about 150 to about 750 seconds without damaging the optical and electrical properties of the polycrystalline cell. Thereafter, the hydrogen treated layer of the polycrystalline cell can be nucleated with a negatively doped hydrogen plasma and a silicon-containing feedstock to form a negatively doped, microcrystalline tunnel junction or microcrystalline recombination junction ($\mu$n) layer having a thickness of about 50 Å to about 120 Å, preferably about 80 Å to about 100 Å.

The microcrystalline tunnel junction layer can also comprise a composite microcrystalline tunnel junction or composite microcrystalline recombination junction layer. The composite microcrystalline tunnel junction layer can comprise a negatively doped microcrystalline tunnel junction ($\mu$n-type) layer and a positively doped microcrystalline tunnel junction ($\mu$p-type) layer. The negatively doped microcrystalline tunnel junction $\mu$n-layer can be disposed between the n layer of the amorphous silicon-containing cell and the positively doped microcrystalline tunnel junction up-layer. The positively doped microcrystalline tunnel junction Slayer can be disposed between the $\mu$n-layer and the p-layer of the polycrystalline cell. The tunnel junction can be doped with phosphine, such as at the following ratio: 10,000 hydrogen: 100 silane: 2 phosphine. The microcrystalline tunnel junction layer can also include a microcrystalline tunnel junction Slayer comprising p-doped microcrystalline silicon. The player can comprise p-doped amorphous silicon.

The surface of the amorphous silicon i-layer can be etched for a period of about 300 to about 500 seconds with a hydrogen plasma etchant The n-type doped layer can be nucleated to form an n-type microcrystalline silicon layer having a thickness of about 80 Å to about 100 Å. A microcrystalline tunnel junction p-layer can be formed by subjecting the microcrystalline tunnel junction An-layer to a positively doped hydrogen plasma and a silicon-containing feedstock to form the microcrystalline tunnel junction $\mu$p-layer on the microcrystalline tunnel junction $\mu$n-layer.

Hydrogen plasma etching provides a relatively fast nucleation period and a speedy induction time for microcrystalline growth. Surface treatment by plasma etching, such as hydrogen plasma deposition, provides uniformly etched and smooth surfaces without damaging the optical and electrical properties or detracting from the appearance of the photovoltaic device. It is believed that plasma etching does not crystallize the surface, but serves as a catalyst and promoter to enhance microcrystalline nucleation and growth.

At least one of the doped layers of the amorphous silicon-containing solar cells can also comprise a microcrystalline doped layer which is positioned adjacent to and abuts against the etched surface of the i-layer. Desirably, the microcrystalline doped layer has a thickness of about 50 Å to about 120 Å. The microcrystalline doped layer, microcrystalline tunnel junction layer or microcrystalline recombination junction layer should be thin, preferably 50–120 Å, and most preferably 80–100 Å to: (1) establish an electrical field inside the intrinsic i-layer, (2) increase reflection of light to the i-layer, and (3) minimize absorption. Preferably, the etched surface of the i-layer in the solar cell comprises a hydrogen etched surface without silane so as to promote nucleation of the subsequently deposited microcrystalline doped layer. The microcrystalline silicon ($\mu$c-Si) after etching can improve the conversion efficiency of the tandem amorphous silicon (a-Si:H) solar cell by more than 10%.

Table 1 below summarizes the typical condition and duration for the $H_2$ plasma treatment to promote fast nucleation of $\mu$c-Si layer. It should be noted that a minimum duration of $H_2$ plasma treatment (hydrogen etching) is desirable in order to allow immediate nucleation of subsequently deposited $\mu$c-Si layer. The minimum duration of hydrogen etching ($H_2$ plasma) is about 150 seconds, depending on the plasma condition.

TABLE 1

Typical Condition for $H_2$ Plasma Treatment

| Temperature (° C.) | Pressure (Torr) | $H_2$ flow rate (sccm) | Power density (mW/cm$^2$) | Duration (sec) |
|---|---|---|---|---|
| 80–300 | 0.5–5 | 100–2000 | 50–230 | 150–750 |

TABLE 2

Typical Condition for $\mu$c-Si Layer Deposition

| Temperature (° C.) | Pressure (Torr) | Power Density (mW/cm$^2$) | $H_2$/SiH$_4$ ratio |
|---|---|---|---|
| 80–300 | 0.5–5 | 50–230 | 50–200:1 |

Tandem and other multi-junction solar cells are intrinsically more stable than single-junction photovoltaic devices with the same light absorbing capabilities. Multi-junction solar cells can have layers of hydrogenated amorphous silicon separated by a tunnel junction and arranged in a stacked configuration. The thickness of the layers can be adjusted to maximize efficiency and equalize the current generated in each layer. The multi-junction solar cells can have the bandgap of the amorphous silicon layers varied by adjusting the hydrogen concentration in the amorphous silicon layers.

The most significant measure of a solar cell is its conversion efficiency. The conversion efficiency is the percentage of the energy of the light impinging on the cell converted to electrical energy which can be used by an external load, e.g. light bulb.

The energy in sunlight (striking a flat surface at solar noon) is about 100 mW/cm$^2$. For convenience solar simulators are calibrated so that the energy that they radiate is as close as possible to 100 mW/cm$^2$. Therefore, the procedure is to measure how much energy is being produced by the cell when illuminated.

The output of a solar cell can be determined by: $V_{oc}$32 open circuit voltage, $P_{max}$=maximum solar cell power and $J_{sc}$=short circuit current The cell efficiency is determined by the maximum amount of power it can produce, which is the power at the maximum power point. While conversion efficiency can be defined as the ratio of energy produced to energy incident, it can also be defined in terms of power. The conversion efficiency of a solar cell can be determined as follows:

$$\text{Efficiency}(\%) = (P_{max}/P_{incident}) \times 100$$
$$= (P_{max}/100) \times 100$$
$$= P_{max}$$
$$\text{Efficiency} = P_{max} = V_{max} \times J_{max}$$
$$= V_{oc} \times J_{sc} \times FF$$

$V_{oc}$=Open circuit voltage, i.e. the voltage developed by cell in situation where no current is drawn (cell is open circuited). If you measure the voltage across the terminals of your car battery with a voltmeter, you will be measuring the open circuit voltage (a little over 12V).

$J_{sc}$=Short circuit current, i.e. the current passed by cell if it is short circuited. If you drop a wrench across the terminals of your car battery, you will be passing the short circuit current (hundreds of amps) through the wrench. Short circuit currents on solar cells are much smaller and not nearly as dangerous.

FF=ratio of $P_{max}$ to $V_{oc} \times J_{sc}$

Efficiency is really given by: Efficiency=($P_{max}/P_{incident}$)× 100. However, in practice $p_{incident}$ (power of light incident on cell) is set to 100 so that efficiency=$P_{max}$. Fill factor (FF) is a number used to express efficiency in terms of open circuit voltage ($V_{oc}$) and short circuit current ($J_{sc}$).

Alternative Feedstocks

While silane and hydrogen are the preferred feedstocks for amorphous silicon cells, there are many alternative feedstocks for undoped plasma-enhanced chemical vapor deposition (CVD) glow discharge a-Si:H and a-SiC:H alloys. The diluent hydrogen ($H_2$) can be replaced by deuterium (D), with the diluent gas being HD or $D_2$. The alternative feedstocks for silane (SiH$_4$), in addition to SiH$_4$ or instead of SiH$_4$, can be expressed by the following general formula: Si$_N$H$_{2N+2-M}$Y$_M$, where Si is silicon, H is hydrogen or deuterium, Y is a halogen, e.g. fluorine (F), chlorine (Cl), etc., N and M are positive integers under the constraint that N≧1 and 2N+2-M≧0. The examples of the above expression include silane (SiH$_4$), N=1, M=0, disilane (Si$_2$H$_6$), N=2, M=0, SiF$_4$ (N=1, M=4, Y=fluorine), SiHF$_3$ (N=1, M=3, Y=fluorine), Si$_2$H$_2$Cl$_4$ (N=2, M=4, Y=chlorine), tetramethyl silane, etc. When the alternative Si feedstocks are used, the optimal or preferred deposition conditions may have to be adjusted.

For hydrogenated amorphous silicon carbon (a-SiC:H) deposition, the alternative carbon feedstocks are numerous indeed In general, most typical hydrocarbons or hydrogen-halogen-carbon compounds can be used, e.g. CH$_4$, C$_2$H$_2$, C$_2$H$_4$, C$_2$H$_6$, CF$_4$, C$_3$H$_8$, CDCl$_3$. Other carbon feedstocks can be used which contain built-in carbon-silicon bonds, which can be expressed by the formula: $CH_N(SiH_3)_{4-N}$, where N is an integer in the range of 0 to 4, e.g. $CH_3SiH_3$ (methylsilane or silylmethane), $CH_3(SiH)_3$ (trisilymethane). The H in the second compound ($SiH_3$) in the above formula can be replaced by a halogen, e.g. $CH(SiF_3)_3$. When an alternative carbon feedstock is used in addition to or in place of methane ($CH_4$), the deposition parameters such as $H_2$-dilution ratio and power density can be adjusted accordingly. In the process, deposition conditions of high pressure, low temperature and high diluent concentrations are used to attain stable solar cells with high open circuit voltages ($V_{oc}$) and high fill factors (FF).

The absence of significant amounts of carbon radicals in amorphous silicon carbon can enhance microcrystalline silicon formation as can very high $H_2$-dilution. The deposition process may be applied to a-Si:H or other materials deposition using enhanced plasma CVD.

This process covers the direct and remote plasma-CVD deposition of any material under conditions similar to those described above. Deposition parameters such as power density or electrical bias may be varied, if desired. Increased hydrogen dilution can improve a-SiC:H wide-gap material. Hydrogen plasma etching can provide good surface coverage by the hydrogen during growth, so as to attain higher surface mobility of growth pre-cursers and a better chance of hydrogen compensation of defects in microcrystalline tunnel junctions. Hydrogen plasma etching can also provide more uniform growth and less ion bombardments at the growth surface.

TABLE 3

RF Deposition Conditions

| Deposition Parameter | Broad Range | Intermediate Range | Preferred Range |
|---|---|---|---|
| RF power density (mW/cm²) | 5–1000 | 20–150 | 40–80 |
| Substrate Temperature (° C.) | 20–250 | 80–180 | 120–150 |
| Deposition Pressure (Torr) | 0.2–50 | 0.5–20 | ≈6–12 |
| H₂ (hydrogen) dilution ratio | 5–1000 | 20–400 | 40–200 |
| Total gas flow rate (sccm) | 10–10,000 | 50–4,000 | 1,000–2,500 |
| Deposition rate (Å/sec) | 0.1–20 | 0.3–4.0 | 0.5–2.5 |
| AC power frequency (MHZ) | 0:1–10,000 | 2–500 | 10–100 |
| Electrode spacing (cm) | 0.2–10 | 0.5–4 | 1.2–2.5 |

EXAMPLES 1–6

Six 4 ft² photovoltaic (PV) modules of tandem (dual) junction solar cells were prepared, constructed and arranged as described above in connection with FIG. 2, except the zinc oxide inner layer of the rear contact was deposited after interconnect scribing, i.e., the amorphous silicon-containing semiconductor layers were scribed by a laser before zinc oxide deposition. A trench was cut through the amorphous silicon-containing semi-conductor layers with the laser. The zinc oxide layer was then deposited by low pressure chemical vapor deposition (LP CVD). Aluminum was deposited to a thickness of 2000 Å on the zinc oxide layer by sputtering to form the outer rear layer of the rear contact. The trenches were filled with aluminum to provide aluminum interconnects. Module 4 had a silver (Ag) outer layer and silver interconnect instead of aluminum.

Modules 3–5 were encapsulated with ethylene vinyl acetate (EVA) as described in connection with the process of FIG. 4. Module 6 was encapsulated with an ultraviolet (UV) curable coating. Modules 1 and 2 were encapsulated with an encapsulant comprising: a UV curable coating, Nuvasil type plastic, and Tefzel type plastic film.

The modules were measured before and after being subjected to 14 humidity freeze cycles for: open circuit voltage (Voc), short circuit cent (Isc), efficiency (Eff), and series resistance (Rs). The results of the tests are indicated below in Table 4. The humidity freeze tests showed substantial degradation and instability of the interconnects and significant increase of series resistance and decrease of efficiency of the photovoltaic modules whore interconnect scribing were performed before zinc oxide deposition The zinc oxide appeared to degrade and adversely effect the interconnects.

TABLE 4

Zinc Oxide Deposition After Interconnect Scribing

| | Before Humidity Freeze | | | | After Humidity Freeze | | | |
|---|---|---|---|---|---|---|---|---|
| Module | Voc | Isc | Eff | Rs | Voc | Isc | Eff | Rs |
| 1 | 24.16 | 478.2 | 7.79 | 9.51 | 24.05 | 472.2 | 6.91 | 13.43 |
| 2 | 23.92 | 485.5 | 8.1 | 8.81 | 24.29 | 487.2 | 7.58 | 12.03 |
| 3 | 24.04 | 485.1 | 7.85 | 10.27 | 24.11 | 479.9 | 6.04 | 26.17 |
| 4 | 24.24 | 484.7 | 7.86 | 8.86 | 24.53 | 485.5 | 8.04 | 9.23 |
| 5 | 24.10 | 481.3 | 7.50 | 11.60 | 24.05 | 477.8 | 5.8 | 30.10 |
| 6 | 23.92 | 482.0 | 6.44 | 18.61 | 23.30 | 471.9 | 4.04 | 63.66 |

EXAMPLES 7–18

Six 4 ft² photovoltaic PV) modules, namely modules 7–12 comprising tandem (dual) junction monolithic solar cells were prepared, constructed and arranged in a manner as previously described in connection with FIG. 2 and Examples 1–6, except the zinc oxide inner layer of the rear contact was deposited by LP CVD before interconnect scribing, so that the amorphous silicon-containing semiconductor layers and zinc oxide were simultaneously scribed by a laser and a trench was cut through amorphous silicon-containing semiconductor layers and the zinc oxide by the laser before the 2000 Å thick, aluminum outer rear layer of the rear contact was deposited on the zinc oxide. The trenches were filled with aluminum to provide aluminum interconnects.

Six 4 ft² photovoltaic modules, namely, modules 13–18, comprising single junction, monolithic, amorphous silicon solar cells were also prepared, constructed and arranged as described in connection with FIG. 1 such that the zinc oxide inner layer of the rear contact was deposited by LP CYD before interconnect scribing, so that the amorphous silicon-containing semiconductor layers and zinc oxide were simultaneously scribed by a laser and a trench was cut through amorphous silicon-containing semiconductor layers and the zinc oxide by the laser before the 2000 Å thick aluminum outer rear layer of the rear contact was deposited on the zinc oxide. The trenches were filled with aluminum to provide aluminum interconnects.

Modules 11, 12, 15, and 16 were encapsulated with ethylene vinyl acetate (EVA) as described in connection with the process of FIG. 4. Modules 7, 8, 13 and 14 were encapsulated with an ultraviolet (UV) curable coating. Modules 9, 10, 15, and 16 were encapsulated with an encapsulant comprising: a UV curable coating, Nuvasil type plastic, and Tefzel type plastic film.

The modules were measured before and after 10 humidity freeze cycles for: open circuit voltage (Voc), short circuit current (Isc), efficiency (Eff), and series resistance (Rs). The results of the tests are indicated below in Table 5. The humidity freeze tests unexpectedly and surprisingly showed stability of the interconnect without significant adverse degradation, as well as minimal changes in efficiency and insubstantial increases in series resistance of the photovoltaic modules. Good mechanical and electrical contact was made by the interconnects between the front and back (rear) contacts. The zinc oxide layer of the rear contact improved reflection of the solar cells.

The process substantially solved the problem of degradation of the interconnects by removing zinc oxide from the interconnect region. The aluminum back metal is an excellent material to adhere to the front contact in the interconnect region and also conducts electricity better than zinc oxide. The aluminum interconnects made a solid direct connection to the front contact from the back (rear) layer of the rear contact without compromising high initial performance and long term stability of the photovoltaic modules.

TABLE 5

Zinc Oxide Deposition Before Interconnect Scribing

| | Before Humidity Freeze | | | | After Humidity Freeze | | | |
|---|---|---|---|---|---|---|---|---|
| Module | Voc | Isc | Eff | Rs | Voc | Isc | Eff | Rs |
| 7 | 20.30 | 419.8 | 5.75 | 9.67 | 20.39 | 414.9 | 5.66 | 9.86 |
| 8 | 25.25 | 499.4 | 8.60 | 8.70 | 25.29 | 499.7 | 8.66 | 8.75 |
| 9 | 20.17 | 500.0 | 8.02 | 8.88 | 25.10 | 586.1 | 8.83 | 8.85 |
| 10 | 25.27 | 503.2 | 9.24 | 7.50 | 25.41 | 501.7 | 9.19 | 7.68 |
| 11 | 20.68 | 423.4 | 5.76 | 10.49 | 20.68 | 425.1 | 5.79 | 10.34 |
| 12 | 25.05 | 501.0 | 8.77 | 8.66 | 24.97 | 501.3 | 8.84 | 8.45 |
| 13 | 22.76 | 369.8 | 5.5 | 13.48 | 23.13 | 367.9 | 5.0 | 21.06 |
| 14 | 22.86 | 373.5 | 5.56 | 12.59 | 23.36 | 368.6 | 5.31 | 17.69 |
| 15 | 23.09 | 378.4 | 5.24 | 16.68 | 23.16 | 374.2 | 4.78 | 22.48 |
| 16 | 23.16 | 369.5 | 5.43 | 14.77 | 23.34 | 366.5 | 4.96 | 22.25 |
| 17 | 22.85 | 370.4 | 5.15 | 16.55 | 23.06 | 367.7 | 4.55 | 28.46 |
| 18 | 22.94 | 368.9 | 5.31 | 14.61 | 23.45 | 374.0 | 5.47 | 16.07 |

Among the many advantages of processes and photovoltaic modules of the present invention are:

1. Superb photovoltaic modules.
2. Excellent electrical capabilities, capacities and ratings.
3. High performance.
4. Long term stability.
5. Better resistance to degradation from thermal cycling.
6. High integrity interconnects.
7. Strong mechanical and superior electrical interconnections between the front and rear contacts.
8. Excellent ability to capture and convert a broader spectrum of sunlight into electricity.
9. Outstanding flexibility to fine tune and control the electrical properties of the solar cell
10. Greater power and short circuit current density.
11. Higher long term conversion efficiency and open circuit voltage.
12. Better conductivity.
13. Lower activation energy.
14. Closer to valence and energy bands.
15. Enhanced ohmic contact and hole properties.
16. More efficient to establish electrical fields.
17. Good fill factor.
18. Economical.

Although embodiments of this invention have been shown and described, it is to be understood that various modifications and substitutions, as well as rearrangements of parts, components, and process steps, can be made by those skilled in the art without departing from the novel spirit and scope of this invention.

What is claimed is:

1. A photovoltaic module, comprising:

a front contact;

a back contact;

each of said contacts comprising a semiconductor comprising a transparent conductive oxide selected from the group consisting of tin oxide, indium-tin oxide, zinc oxide, and cadmium stannate;

at least one amorphous silicon-containing cell positioned between said contacts;

a substrate positioned adjacent one of said contacts opposite said cell such that said adjacent contact is positioned between said cell and said substrate;

the back contact comprising a dual layer comprising said transparent conductive oxide and a metallic layer comprising a metal selected from the group consisting of aluminum, silver, molybdenum, platinum, steel, iron, niobium, titanium, chromium, bismuth, antimony, and the oxides of the preceding and;

at least one interconnect extending between the metallic layer of the back contact and the front contact and connecting the metallic layer with the front contact, said interconnect being formed by laser scribing a trench through the transparent conductive oxide layer of the back contact and said amorphous silicon-containing cell and immediately thereafter filling said trench with said metallic layer.

2. A photovoltaic module in accordance with claim 1 wherein said amorphous silicon-containing cell comprises a portion of a solar cell selected from the group consisting of hydrogenated amorphous silicon, hydrogenated amorphous silicon carbon, and hydrogenated amorphous silicon germanium.

3. A photovoltaic module in accordance with claim 1 wherein said cell is selected from the group consisting of a single junction cell, a tandem junction cell, a multi-junction cell, a p-i-n cell, a n-i-p cell, and a cell comprising microcrystalline silicon.

4. A photovoltaic module in accordance with claim 1 wherein said substrate is selected from the group consisting of a vitreous substrate, a glass substrate, a stainless steel substrate, and a metal substrate.

5. A photovoltaic module in accordance with claim 1 wherein said transparent conductive oxide of said dual layer contact comprises zinc oxide.

6. A photovoltaic module in accordance with claim 1 wherein said metal in said metallic layer of said dual layer contact comprises aluminum.

7. A photovoltaic module in accordance with claim 1 wherein said front contact comprises a dielectric layer.

8. A photovoltaic module in accordance with claim 1 wherein:

said interconnect comprises the same metal as said metallic layer of said dual layer back contact.

9. A photovoltaic module, comprising:

a multi-junction solar cell selected from the group consisting of a tandem solar cell, a dual junction solar cell, and a triple junction solar cell, said multi-junction solar cell comprising:

a vitreous light-transmissive substrate selected from the group consisting of transparent glass and translucent glass;

a front contact comprising a transparent metallic oxide layer on said vitreous light-transmissive substrate, said transparent metallic oxide layer comprising a front semiconductor being selected from the group consisting of tin oxide, indium-tin oxide, zinc oxide, and cadmium stannate;

a dual layer back contact comprising an outer metallic layer and an inner layer;

said outer metallic layer of said dual layer back contact comprising a metal selected from the group consisting of aluminum, silver, molybdenum, platinum, steel, iron, niobium, titanium, chromium, bismuth, antimony, and oxides of the preceding;

said inner layer of said dual layer back contact comprising a semiconductor comprising a transparent conductive oxide selected from the group consisting of zinc oxide, tin oxide, indium-tin oxide, and cadmium stannate;

an amorphous silicon cell comprising hydrogenated amorphous silicon positioned adjacent and abutting against said front semiconductor of said front contact;

an amorphous silicon germanium cell comprising hydrogenated amorphous silicon germanium abutting against said amorphous silicon cell and being positioned between said amorphous silicon cell and said semiconductor of said dual layer back contact; and at least one interconnect extending between the metallic layer of the back contact and the front contact and connecting the metallic layer with the front contact, said interconnect being formed by laser scribing a trench through the transparent conductive oxide layer of the back contact and said amorphous silicon-containing cells and immediately after filling said trench with said metallic layer.

10. A photovoltaic module in accordance with claim 9 including:

a vitreous light-transmissive superstrate selected from the group consisting of transparent glass, and opaque glass; and an encapsulant comprising ethylene vinyl acetate positioned between and abutting against said superstrate and said outer metallic layer of said dual layer back contact.

11. A photovoltaic module in accordance with claim 9 wherein:

said outer metallic layer of said dual layer back contact comprises aluminum;

said interconnect comprises aluminum; and said inner layer of said dual layer back contact comprises zinc oxide.

12. A photovoltaic module in accordance with claim 11 wherein:

said transparent metallic oxide layer of said front contact comprises tin oxide: and said cells are selected from the group consisting of p-i-n cells and n-i-p cells.

13. A photovoltaic module in accordance with claim 12 wherein said front contact further comprises a dielectric layer comprising silicon dioxide positioned on said tin oxide.

14. A photovoltaic module in accordance with claim 9 including a microcrystalline silicon cell positioned between and abutting against said amorphous silicon germanium cell and said semiconductor of said dual layer back contact.

15. A photovoltaic module in accordance with claim 9 wherein said multi-junction cell comprises a microcrystalline segment selected from the group consisting of a microcrystalline tunnel junction, a p-doped microcrystalline layer, and an n-doped microcrystalline layer.

16. A photovoltaic module, comprising:

a multi-junction solar cell comprising:

a vitreous light-transmissive substrate selected from the group consisting of transparent glass and translucent glass;

a front contact comprising a transparent metallic oxide layer on said vitreous light-transmissive substrate, said transparent metallic oxide layer comprising a front semiconductor selected from the group consisting of tin oxide, indium-tin oxide, zinc oxide, and cadmium stannate;

a dual layer back contact comprising an outer metallic layer and an inner layer;

said outer metallic layer of said dual layer back contact comprising a metal selected from the group consisting of aluminum, silver, molybdenum, platinum, steel, iron, niobium, titanium, chromium, bismuth, antimony, and oxides of the preceding;

said inner layer of said dual layer back contact comprising a semiconductor comprising a transparent conductive oxide selected from the group consisting of zinc oxide, tin oxide, indium-tin oxide, and cadmium stannate;

an amorphous silicon cell comprising hydrogenated amorphous silicon;

an amorphous silicon germanium cell comprising hydrogenated amorphous silicon germanium;

a microcrystalline segment selected from the group consisting of a microcrystalline tunnel junction, a p-doped microcrystalline layer, and an n-doped microcrystalline layer; and at least one interconnect extending between the metallic layer of the back contact and the front contact and connecting the metallic layer with the front contact, said interconnect being formed by laser scribing a trench through the layers comprising the amorphous silicon cell, the amorphous silicon germanium cell and the microcrystalline segment.

* * * * *